(12) United States Patent
Horch

(10) Patent No.: US 8,373,167 B2
(45) Date of Patent: Feb. 12, 2013

(54) RFID TAG HAVING NON-VOLATILE MEMORY DEVICE HAVING FLOATING-GATE FETS WITH DIFFERENT SOURCE-GATE AND DRAIN-GATE BORDER LENGTHS

(75) Inventor: Andrew E. Horch, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 747 days.

(21) Appl. No.: 12/006,330

(22) Filed: Dec. 31, 2007

(65) Prior Publication Data

US 2008/0185627 A1 Aug. 7, 2008

Related U.S. Application Data

(62) Division of application No. 11/701,710, filed on Feb. 2, 2007, now Pat. No. 7,939,861.

(51) Int. Cl.
*H01L 29/78* (2006.01)
(52) U.S. Cl. ............ 257/59; 257/249; 257/239; 257/315
(58) Field of Classification Search .................. 257/249, 257/239, 59; 365/149
See application file for complete search history.

(56) References Cited

U.S. PATENT DOCUMENTS

| | | | |
|---|---|---|---|
| 5,598,369 A | 1/1997 | Chen et al. | |
| 5,657,271 A | 8/1997 | Mori | |
| 5,872,732 A * | 2/1999 | Wong | ....................... 365/185.18 |
| 6,143,607 A | 11/2000 | Chi | |
| 6,181,601 B1 | 1/2001 | Chi | |
| 6,442,074 B1 | 8/2002 | Hamilton et al. | |
| 6,510,086 B2 | 1/2003 | Kato et al. | |
| 6,544,121 B2 * | 4/2003 | DeWeese et al. | ................ 463/30 |
| 6,566,695 B2 * | 5/2003 | Kumashiro | .................... 257/249 |
| 6,579,750 B1 * | 6/2003 | Krivokapic | .................... 438/149 |
| 6,781,881 B2 | 8/2004 | Chih | |
| 6,950,342 B2 | 9/2005 | Lindhorst et al. | |
| 7,158,401 B2 * | 1/2007 | Bhattacharyya | ............... 365/149 |
| 7,332,386 B2 * | 2/2008 | Lee et al. | ....................... 438/197 |
| 7,474,568 B2 | 1/2009 | Horch | |
| 7,508,719 B2 | 3/2009 | Horch | |
| 2002/0027233 A1 | 3/2002 | Yamaki et al. | |
| 2002/0159298 A1 | 10/2002 | Hirano | |
| 2008/0049519 A1 | 2/2008 | Horch | |
| 2008/0056010 A1 | 3/2008 | Horch | |
| 2008/0279013 A1 | 11/2008 | Horch et al. | |

OTHER PUBLICATIONS

Chang, C.Y. et al., "ULSI Devices", John Wiley & Sons, pp. 119-124, 2000.
Chen, Ih-Chin et al., "A Quantitative Physical Model for the Band-to-Band Tunneling-Induced Substrate Hot Electron Injection in MOS Devices", IEEE Transactions on Electron Devices, vol. 39, No. 7, pp. 1646-1651, Jul. 1992.

(Continued)

*Primary Examiner* — Steven Loke
*Assistant Examiner* — David Goodwin
(74) *Attorney, Agent, or Firm* — Fenwick & West LLP

(57) ABSTRACT

Non-volatile memory (NVM) devices are disclosed. In one aspect, a NVM device may include a substrate, and a field-effect transistor (FET). The FET may include a first doped region in the substrate and a second doped region in the substrate. The first and the second doped regions may define a channel region of the substrate between them. An insulating layer may overlie the channel region. A floating gate may overlie the insulating layer. Charge of an amount that encodes a value may be stored on the floating gate. The floating gate and the first and the second doped regions may be shaped such that the floating gate defines with the first doped region a first border of a first length, and the floating gate defines with the second doped region a second border of a second length that is less than 90% of the first length.

14 Claims, 13 Drawing Sheets

OTHER PUBLICATIONS

Figueroa, Miguel et al., "A Mixed-Signal Approach to High-Performance Low-Power Linear Filters", IEEE Journal of Solid State Circuits, vol. 36, No. 5, pp. 816-822, May 2001.

Hyde, John et al., "A floating-gate trimmed, 14-bit, 250 Ms/s digital-to-analog converter in standard 0.25 μm CMOS", Symposium on VLSI Circuits Digest of Technical Papers, pp. 328-331, 2002.

Office Action for U.S. Appl. No. 11/601,305 mailed May 22, 2008.
Response to Office Action for U.S. Appl. No. 11/601,305, filed on Sep. 22, 2008.
Office Action for U.S. Appl. No. 11/601,474 mailed Dec. 28, 2007.
Response to Office Action for U.S. Appl. No. 11/601,474, filed on Mar. 28, 2008.

\* cited by examiner

*FET WITH FLOATING GATE -
SIDE VIEW*

*FET WITH FLOATING GATE -
TOP VIEW*

*FET WITH FLOATING GATE USED AS A MEMORY CELL (SIDE VIEW)*

*FET WITH FLOATING GATE USED AS A MEMORY CELL (TOP VIEW)*

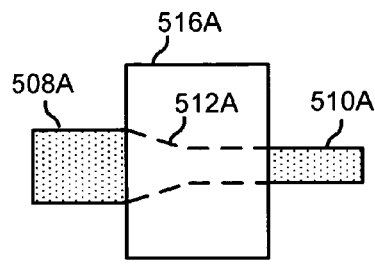
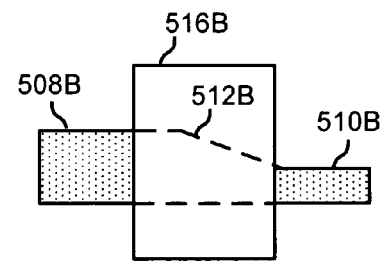
FIG. 5A  FIG. 5B
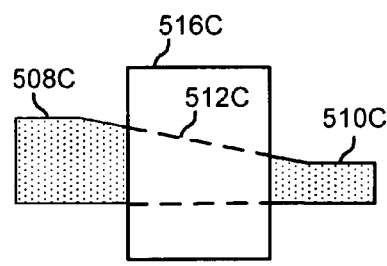
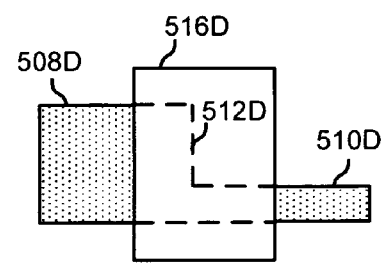
FIG. 5C  FIG. 5D
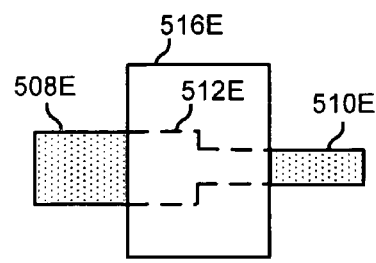
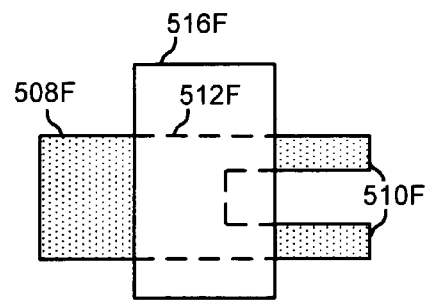
FIG. 5E  FIG. 5F

NON VOLATILE MEMORY CELL WITH ASYMMETRIC FET

RFID TAG HAVING NON-VOLATILE MEMORY DEVICE HAVING FLOATING-GATE FETS WITH DIFFERENT SOURCE-GATE AND DRAIN-GATE BORDER LENGTHS

The present application is a divisional of and claims priority to U.S. application Ser. No. 11/701,710, filed Feb. 2, 2007 now U.S. Pat. No. 7,939,861.

BACKGROUND

1. Field

Embodiments of the invention relate to non-volatile memory (NVM) devices. In particular, embodiments of the invention relate to NVM devices having floating gate field-effect transistors (FETs) with different source-gate and drain-gate border lengths.

2. Background Information

Various field-effect transistors (FETs) having floating gates, their properties, and their uses, are known in the arts. Two different examples of which are shown in FIGS. 1A-1B and FIGS. 2A-2B.

FIG. 1A is a cross-sectional side view of a prior art FET 100 having a floating gate 116. The FET includes a first doped region 108 in a substrate 106, and a second doped region 110 in the substrate. The first and the second doped regions define a channel region 112 of the substrate between them. A dielectric or other insulating layer 114 of the FET is over the channel region. The floating gate 116 is over the insulating layer. The floating gate 116 may be sufficiently insulated or isolated to store a charge thereon. Vertical sidewall spacers 118 are alongside the vertical sidewalls of the floating gate 116.

FIG. 1B is a top planar view of the prior art FET 100 of FIG. 1A. A section line labeled [FIG. 1A] is used to show the cross-sectional view of FIG. 1A. Notice that the border lengths (L0) between the floating gate and each of the doped regions are substantially equal. In practice, the border lengths may differ slightly due to manufacturing variability and/or imprecision, although the difference is typically less than 8%.

FETs having floating gates are commonly used as non-volatile memory (NVM) devices. In these applications, the floating gate may be used to store charge of an amount that encodes a value.

FIG. 2A is a cross-sectional side view of a prior art NVM device 201. The NVM device includes a first FET 200A and a second FET 200B. In this particular case the FETs are implemented as pFETs. An isolation region 204, such as shallow trench isolation (STI) separates and isolates the first and second FETs.

The first FET 200A includes a first doped region 208 and a second doped region 210 formed in an N-well 206 of a substrate 202. A channel region 212 of the substrate is defined between the first and second doped regions. An insulating layer 214 is over the channel region. A read/write floating gate 216 is over the insulating layer 214. Vertical sidewall spacers 218 are alongside the vertical sidewalls of the read/write floating gate 216.

Likewise, the second FET 200B includes a first doped region 228 and a second doped region 230 in an N-well 226 of the substrate 202. A channel region 232 of the substrate is defined between the first and second doped regions. An insulating layer 234 is over the channel region. A control gate 220 is over the insulating layer 214. Vertical sidewall spacers 238 are alongside the vertical sidewalls of the control gate 220.

FIG. 2B is a top planar view of the prior art pFET-based NVM device of FIG. 2A. A section line labeled [FIG. 2A] is used to show the cross-sectional view of FIG. 2A. Notice that read/write floating gate 216 and the control gate 220 are portions of a larger gate structure and are electrically coupled together. Notice also that the border lengths (L0) between the read/write floating gate 216 and each of the doped regions are substantially equal. In practice, the border lengths may differ slightly due to manufacturing variability and/or imprecision, although the difference is typically less than 8%. In the illustration, the read/write floating gate 216 and the control gate 220 have about the same size, although commonly the control gate may be larger than the read/write floating gate.

Device 201 operates as a memory as follows. A charge of an amount that encodes a value may be stored on the read/write floating gate 216. The read/write floating gate may be sufficiently insulated or isolated to retain the charge for a long time, as is desired for a memory.

In storing the charge on the read/write floating gate 216 in the first place, the control gate device 200B may be used to bias the read/write floating gate device 200A to allow the charge to be stored on the read/write floating gate 216. This may include controlling a voltage of the control gate 220 in order to control a voltage on the read/write floating gate 216. Electrons may be stored on the read/write floating gate 216 through an injection mechanism. The control gate 220 may be used to help turn on the read/write floating gate device 200A in order to store the charge. For example, the read/write floating gate device may be biased in such a way as to invert its channel region. Or the read/write floating gate device can be turned on in order to promote the electron injection onto the read/write floating gate 216. Accordingly, the control gate device 200B may facilitate storage of charge on the read/write floating gate.

However, the control gate 220 and the second FET 200B significantly increase the size of the overall NVM device 201. Elimination of the control gate and the second FET would allow for a smaller NVM device.

Elimination of the control gate may, however, make it difficult to store the charge of the amount that encodes the value on the floating gate. Without being able to separately control the voltage on the floating gate during such write operations, channel flow may be restricted which may tend to reduce the amount of charge that may be stored on the floating gate in a given amount of time.

FIG. 3A is a cross-sectional side view illustrating restriction of channel flow in a pFET-based NVM device 300, which omits a control gate. The pFET-based NVM device includes a P+ doped drain 308 and a P+ doped source 310 in a N-well 306 of a substrate 302. The device also includes a channel region 312, an insulating layer 314, a floating gate 316, and vertical sidewall spacers 318. The voltages of the source, drain, and N-well are capable of being controlled. However, the voltage of the floating gate 316 is not separately controlled, since the NVM device 300 lacks a control gate.

Charge may be stored on the floating gate 316 by impact ionized hot-electron injection (IHEI). The NVM device 300 may be turned on by biasing the source 310 and the N-well 306 to high voltages (e.g., pulling them high) and biasing the drain 308 to a low voltage (e.g., pulling it low). This may tend to promote flow of holes (h+) acting as charge carriers through the channel region 312 as shown.

However, as shown at comment 362, when the source 310 and the N-well 306 are biased to a high voltage, and the drain 308 is biased to a low voltage, then the floating gate 316 may tend to become capacitively coupled up to a high voltage, which in turn may restrict the intended flow of holes through the channel 312. This is because, at least conceptually, there are two sources of capacitance, i.e. from the source 310 and the N-well 306, that may pull the floating gate 316 up to a high voltage, whereas only one source of capacitance, i.e. from the drain 308, may pull the floating gate down to a low voltage. Accordingly, the two sources may dominate, and the voltage on the floating gate may increase.

For a pFET, imposing a high voltage on the floating gate may tend to turn the pFET off. As shown, a separation of charge may occur across the insulating layer 314, with holes (+) concentrated on the floating gate side and electrons (−) concentrated on the channel side. As shown by the "X" this may tend to restrict flow of the holes through the channel 312. This restriction of channel flow may limit the amount of charge that may be stored on the gate in a given amount of time.

FIG. 3B is a cross-sectional side view illustrating restriction of channel flow in an nFET-based NVM device 301, which omits a control gate. The pFET-based NVM device 301 includes an N+ doped drain 309 and an N+ doped source 311 in a P− substrate 303. The device also includes a channel region 313, an insulating layer 315, a floating gate 317, and vertical sidewall spacers 315. As before, the voltages of the source, drain, and N-well are capable of being controlled for operating device 301. However, the voltage of the floating gate 317 is not separately controlled, since the NVM device lacks a control gate.

Charge may be stored on the gate 317 of the nFET by channel hot-electron injection (CHEI). The NVM device may be turned on by biasing the source and the substrate to low voltage (e.g., pulling them low) and biasing the drain to a high voltage (e.g., pulling them high). This may tend to promote flow of electrons (e−) acting as charge carriers through the channel region.

However, as shown at comment 363, when the source and the substrate are biased to a low voltage and the drain is biased to a high voltage, then the floating gate may tend to be capacitively coupled down to a low voltage, which may restrict flow of electrons through the channel. For an nFET, imposing a low voltage on the floating gate may tend to turn the nFET off. As shown, a separation of charge may occur across the insulating layer, with electrons (−) concentrated on the floating gate side and holes (+) concentrated on the channel side. As shown by the "X" this may tend to restrict flow of the electrons (e−) through the channel. This restriction of channel flow may limit the amount of charge that may be stored on the gate in a given amount of time.

BRIEF DESCRIPTION OF THE SEVERAL VIEWS OF THE DRAWINGS

The invention may best be understood by referring to the following description and accompanying drawings that are used to illustrate embodiments of the invention. In the drawings:

FIGS. 5A-5F are top planar views of six illustrative examples of layouts for asymmetric FETs, according to various embodiments of FIG. 4.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 4:
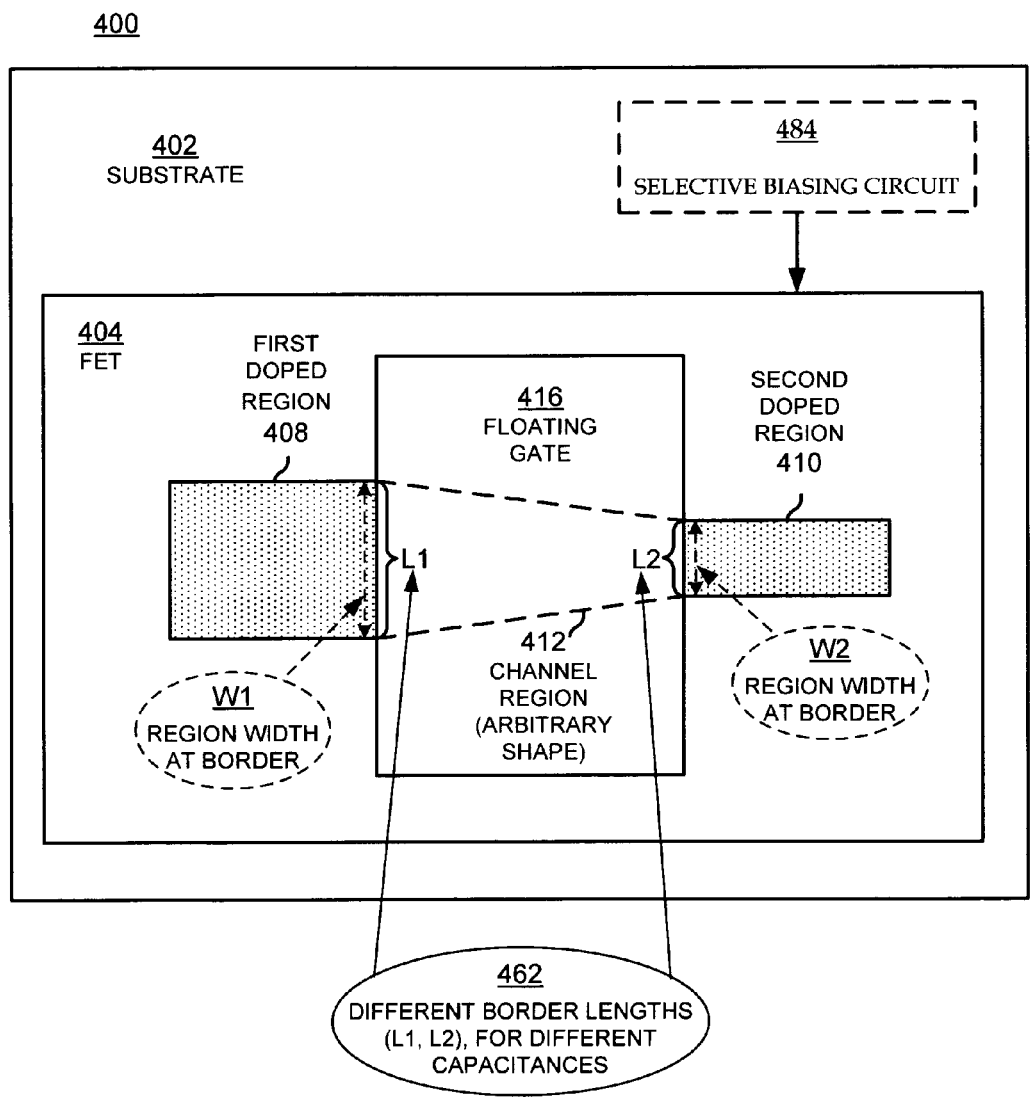
FIG. 4 is a combination diagram for a non-volatile memory device according to embodiments of the invention. The non-volatile memory device includes an optional biasing device and a top planar view of a layout for an asymmetric FET. The FET is asymmetric in that lengths of borders of the doped regions with the floating gate are different.

FIG. 4 is a combination diagram for a non-volatile memory (NVM) cell or other device 400 to store a value, according to embodiments of the invention. The NVM device includes a substrate 402, an asymmetric field-effect transistor (FET) 404 in accordance with embodiments of the invention, and an optional selective biasing circuit 484. The diagram shows a top planar view of a layout for the asymmetric FET. The biasing device 484 is shown in block diagram form, and with dashed lines to indicate that it is optional.

The asymmetric FET 404 includes a first doped region 408 in the substrate 402, and a second doped region 410 in the substrate 402. The first and the second doped regions define a channel region 412 of the substrate between them. A dielectric or other insulating layer (not shown) of the asymmetric FET overlies the channel region. The asymmetric FET also includes a floating gate 416 over the insulating layer.

The floating gate may be used to store charge of an amount that encodes a value. In one or more embodiments of the invention, the charge may be stored on the floating gate in response to one or more signals applied by the selective biasing circuit 484, which may be formed in and/or on the substrate. Conventional selective biasing circuits known in the arts are suitable, and therefore the selective biasing circuit will not be discussed in greater detail. The NVM device lacks a control gate to control a voltage on the floating gate 416. Advantageously, this may allow the NVM device to be smaller.

The FET is asymmetric in that border lengths of the first and second doped regions with the floating gate are different. In particular, the floating gate and the first and the second doped regions are shaped such that the floating gate defines with the first doped region a first border of a first length (L1), and the floating gate defines with the second doped region a second border of a second length (L2). Likewise, border lengths of the first and second doped regions with the channel region are different.

Rather than the first length (L1) and second length (L2) being equal, or substantially equal, in accordance with embodiments of the invention, the second length (L2) may be substantially less than the first length (L1).

Figure 1A:
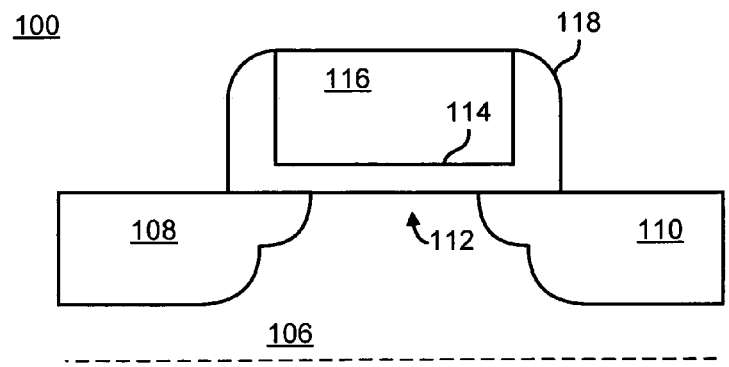
FIG. 1A is a cross-sectional side view of a prior art FET having a floating gate.
Figure 1B:
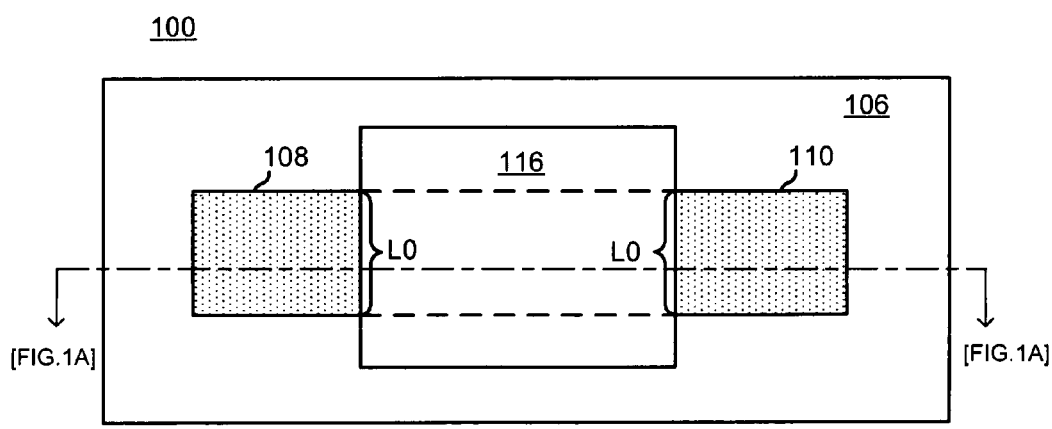
FIG. 1B is a top planar view of the prior art FET of FIG. 1A.
Figure 2A:
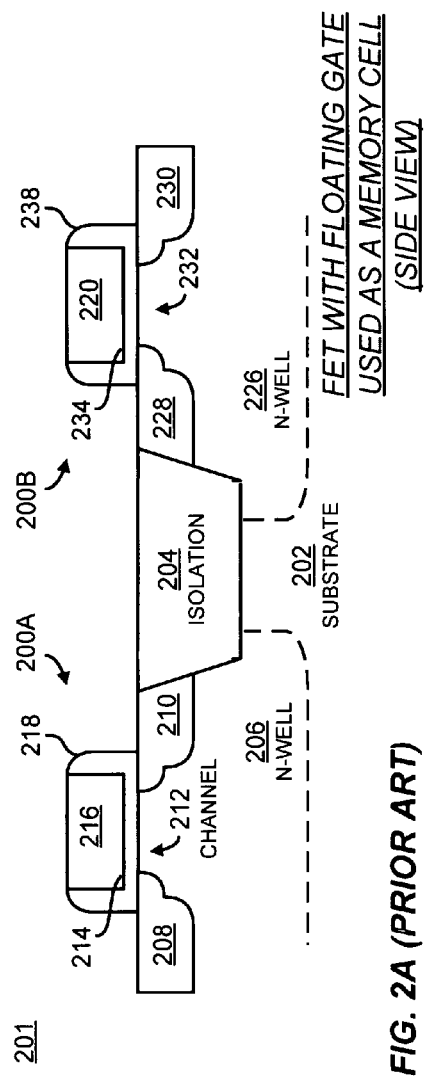
FIG. 2A is a cross-sectional side view of a prior art FET, in this particular case implemented as a pFET, which is used as a non-volatile memory device.
Figure 2B:
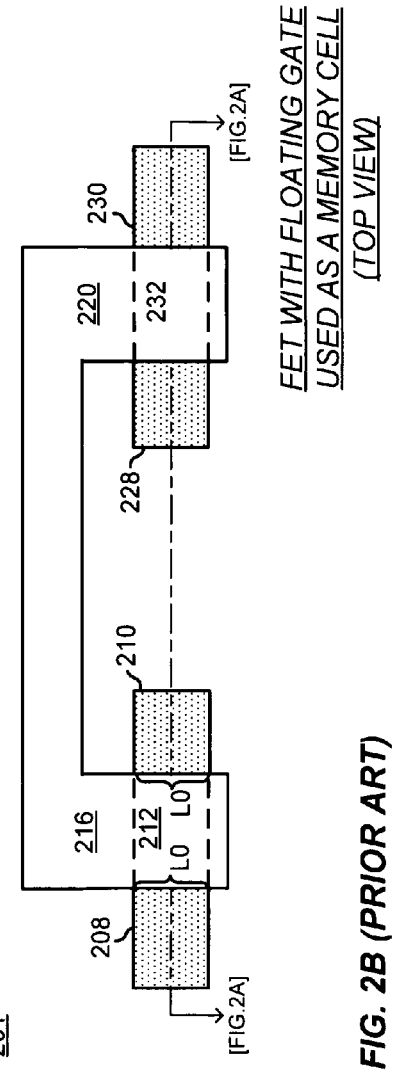
FIG. 2B is a top planar view of the prior art pFET-based non-volatile memory device shown in FIG. 2A.

In embodiments of the invention, the second length (L2) may be less than 90% of the first length (L1). This difference in lengths is intentional and is more than typically expected due to mere manufacturing variability or imprecision. If desired, in one or more embodiments of the invention, the lengths may differ by even greater amounts. For example, in one or more embodiments of the invention, the second border length (L2) may range from about 20% to about 85% of the first border length (L1). Even greater differences may optionally be used, if desired. These different border lengths contrast with the substantially equal border lengths of the FETs shown in FIGS. 1B and 2B.

This extra border length for the first doped region may result in extra capacitance between the first doped region and the floating gate compared to the capacitance between the second doped region and the floating gate. As is known, the capacitance of an ideal parallel plate capacitor increases proportionally with area of the parallel plates assuming the distance between the plates remains fixed. In the case of the asymmetric FET, the area is analogous to the border length multiplied by some overlap distance, and the distance between the plates is analogous to the fixed thickness of the insulating layer. Accordingly, the extra first border length should result in a relatively proportional, or at least direct, increase in the capacitance between the first doped region and the floating gate compared to the capacitance between the second doped region and the floating gate.

To briefly review, as shown at comment 462, in accordance with embodiments of the invention, different border lengths (L1, L2) of the doped regions to the floating gate may be used to provide different capacitances between the doped regions and the floating gate. Advantageously, as will be explained further below, the extra capacitance between the first doped region and the floating gate, when employed drain-side, may help to un-restrict or enhance channel flow, which may facilitate storing the charge of the amount that encodes the value on the floating gate, even when a control gate is not provided.

In embodiments of the invention, the FET may include a pFET in which the first and second doped regions are p-type. Charge retention on the floating gate of a pFET may be better than on an nFET, for example due to the use of a thinner oxide. Alternatively, in embodiments of the invention, the FET may include an nFET in which the first and second doped regions are n-type. Examples of suitable types of FETs include, but are not limited to, metal-oxide-semiconductor field-effect transistors (MOSFETs), metal-semiconductor field-effect transistors (MESFETs), modulation-doped field-effect transistors (MODFETs), and other types of FETs known in the arts.

Now, there are different ways of shaping the floating gate and the doped regions such that the border lengths of the doped regions with the floating gate are different. A first example approach is shown in FIG. 4, and specific examples of this approach will be discussed in conjunction with FIGS. 5A-5F. Then, further below, a second example approach will be discussed in conjunction with FIG. 6, and specific examples of this later approach will be discussed in conjunction with FIGS. 7A-7C.

Referring again to FIG. 4, notice that the widths of the first and second doped regions are different from one another at the borders with the floating gate. In particular, a first width (W1) of the first doped region at the first border with the floating gate is greater than a second width (W2) of the second doped region at the second border with the floating gate. The channel is shown to have an arbitrary shape to indicate that a wide variety of different channel shapes are suitable.

Similarly to the border lengths, in embodiments of the invention, the second width (W2) may be less than 90% of the first width (W1). If desired, in embodiments of the invention, the lengths may differ by even greater amounts. For example, in embodiments of the invention, the second width (W2) may range from about 20% to about 85% of the first width (W1). Even greater differences may optionally be used, if desired.

In the illustrated device, each of the doped regions has a single width. Each of these single widths is the same as the width at the respective border with the floating gate. However, the scope of the invention is not so limited. In alternate embodiments, a doped region may optionally have multiple different widths. In such embodiments, the widths of the doped region that are not at the border of the doped region with the floating gate may vary considerably (the scope of the invention is not particularly limited in this respect), as long as the first width (W1) at the first border is greater than the second width (W2) at the second border.

Now, the illustrated NVM device includes the optional selective biasing circuit, although this is not required. In one or more embodiments of the invention, the selective biasing circuit may optionally be located external to and separate from the NVM device and the substrate. For example, the selective biasing circuit may be a part of manufacturing equipment that is used to store the charge on the floating gate and from which the NVM device is later separated from. As another option, in one or more embodiments of the invention, the selective biasing circuit may initially be part of the substrate while a charge is stored on the floating gate and thereafter be diced, cut, served, or otherwise removed from a remainder of the substrate including the asymmetric FET having the floating gate with the charge stored thereon. Accordingly, the selective biasing circuit is optional, and not required.

FIGS. 5A-5F are top planar views of six illustrative examples of suitable layouts for an asymmetric FET, according to various embodiments of FIG. 4. Each of the layouts shows a first doped region 508 a second doped region 510, a channel region 512 defined between the doped regions, and a floating gate 516 over the channel region. In the drawings, the terminal letters A, B, C, D, E, and F are appended to each of the reference numerals of the respective FIGS. 5A-5F to indicate the components thereof.

In each of FIGS. 5A-5F, the floating gate and the first and the second doped regions are shaped such that the floating gate 516 defines with the first doped region 508 a first border of a first length, and the floating gate 516 defines with the second doped region 510 a second border of a second length that is less than the first length. In embodiments of the invention, the second length is less than 90% of the first length.

Furthermore, in each of FIGS. 5A-5F, a first width of the first doped region 508 at the first border is greater than a second width of the second doped region 510 at the second border. In embodiments of the invention, the second width is less than 90% of the first width.

Still further, in each of FIGS. 5A-5F, the first and second borders are substantially straight. Substantially straight means that there may be jaggedness due to lithographic imperfections, but otherwise the borders are straight and are straight on average. Furthermore, the first and second borders are substantially parallel, which similarly encompasses the possibility of slight angling due to lithographic imperfections.

A more detailed description of each of the layouts is believed to be unnecessary, as these additional details may be readily gleaned from the illustrations, and are not believed to provide substantial further illumination of the broader concepts of the invention. Nevertheless, a brief discussion of factors potentially affecting the choice of layout may be helpful.

One issue potentially affecting the choice of layout is tolerance of the ratio of the border lengths to the possibility of misalignment of the floating gate. For the layouts of FIGS. 5C-5F, the ratio of the first border length to the second border length is tolerant of misalignment of the floating gate. In other words, if the position of the floating gate is shifted slightly to either the right or left, the ratio of the border lengths, and therefore the ratio of the doped region-to-floating gate capacitance, tends to remain about the same. In contrast, for the layouts of FIGS. 5A-5B the ratio of the border lengths may tend to be somewhat more dependent on or changed by misalignment of the floating gate.

Another issue potentially affecting the choice of layout is the presence of sharp internal angles of the channel region beneath the floating gate. Sharp internal angles may tend to accumulate charge, and may be undesired for certain implementations. In the layouts of FIGS. 5A-5C, each of the channels lacks a sharp internal angle having an angle of less than 135°. Accordingly, these layouts may be chosen if preventing accumulation of charge in the channel is worthwhile for the particular implementation. In contrast, in the layouts of FIGS. 5D-5F, each of the channels includes one or more internal angles having an angle of about 90°.

These are just a few illustrative example layouts for asymmetric FETs having different border lengths of the doped regions with the floating gate. Other examples will be apparent to those skilled in the art, and having the benefit of the present disclosure.

Figure 6:
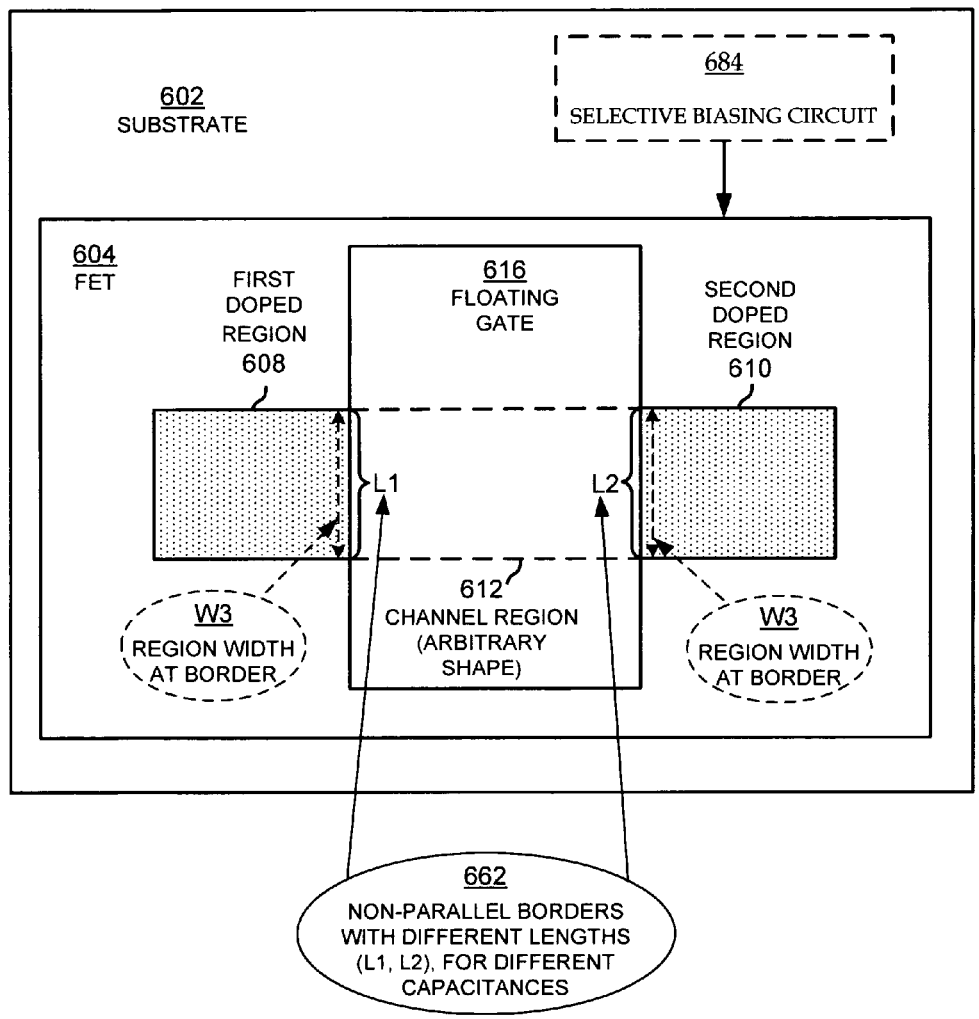
FIG. 6 is a combination diagram for a non-volatile memory device, according to embodiments of the invention. The non-volatile memory device includes an optional biasing device and a top planar view of a layout for an asymmetric FET. The asymmetric FET has non-parallel borders, and in the illustration the widths of the doped regions at the borders are substantially equal.

FIG. 6 is a combination diagram for a non-volatile memory (NVM) cell or other device 600 to store a value, according to embodiments of the invention. The NVM device includes a substrate 602, an asymmetric field-effect transistor (FET) 604 in accordance with embodiments of the invention, and an optional selective biasing circuit 684. The diagram shows a top planar view of a layout for the asymmetric FET. The optional biasing device is shown in block diagram form, and with dashed lines to indicate that the biasing device is optional.

The asymmetric FET includes a first doped region 608 in the substrate, and a second doped region 610 in the substrate. The first and the second doped regions define a channel region 612 of the substrate between them. A dielectric or other insulating layer (not shown) of the asymmetric FET is over the channel region. The asymmetric FET also includes a floating gate 616 over the insulating layer. The floating gate may be used to store charge of an amount that encodes a value.

With a few notable exceptions, these components of the NVM device 600 of FIG. 6 may have the same or similar characteristics of the correspondingly named components of the NVM device 400 of FIG. 4 discussed above. Accordingly, to avoid obscuring the description, the discussion below will primarily focus on the different and/or additional characteristics of the components of the NVM device 600 of FIG. 6.

As before, the FET 604 is asymmetric in that border lengths of the first and second doped regions with the floating gate are different. In particular, the floating gate and the first and the second doped regions are shaped such that the floating gate defines with the first doped region a first border of a first length (L1), and the floating gate defines with the second doped region a second border of a second, different length (L2). The second length (L2) may be less than the first length (L1) as previously described.

In the embodiments of FIG. 6, as shown at comment 662, non-parallel borders with different lengths may be used to achieve different border lengths (L1, L2) for different capacitances. In particular, non-parallel borders with different lengths may be used to achieve a second border length (L2) that is less than a first border length (L1).

Figure 7A:
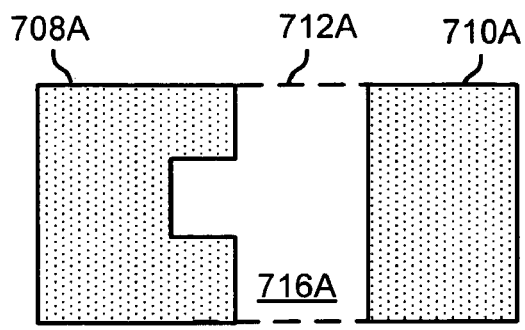
FIGS. 7A-C are top planar views of three illustrative examples of layouts for asymmetric FETs, according to various embodiments of FIG. 6.
Figure 7B:
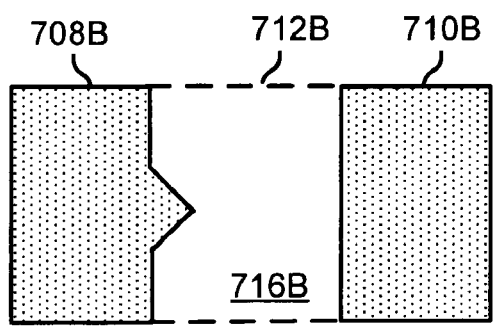
Figure 7C:
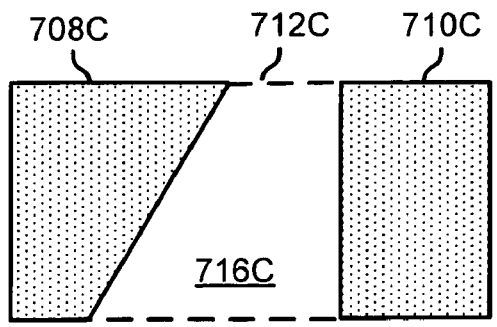

Note that both of the illustrated borders are not intended to be actual borders or coextensive with the width of the doped regions. Rather, the illustrated borders, or at least one of the illustrated borders, is intended to represent an arbitrary non-parallel border to indicate that a wide variety of different non-parallel border shapes, such as, for example, those shown in FIGS. 7A-7C, are suitable. Similarly, the channel is shown to have an arbitrary shape to indicate that a wide variety of different channel shapes are suitable.

Like before, in embodiments of the invention, the second length (L2) may be less than 90% of the first length (L1). If desired, in embodiments of the invention, the lengths may differ by even greater amounts. For example, in embodiments of the invention, the second border length (L2) may range from about 20% to about 85% of the first border length (L1). Even greater differences may optionally be used, if desired.

In the illustrated device of FIG. 6, the widths of the doped regions are shown to be substantially equal, at least at the borders with the floating gate, to illustrate this possibility. As used herein, the widths are substantially equal if they differ in length by less than 8%. In particular, a region width (W3) of the first doped region at the first border with the floating gate is substantially equal to a region width (W3) of the second doped region at the second border with the floating gate. This is in contrast to the embodiments of FIG. 4, in which different widths of the doped regions at the borders with the floating gate were used to achieve different border lengths. The use of the non-parallel borders allows different border lengths to be achieved, even if the widths of the doped regions at the borders are substantially equal.

However, it is not required in the embodiments of FIG. 6 that the widths of the doped regions at the borders are equal or substantially equal. In one or more embodiments consistent with FIG. 6, the widths of the doped regions at the borders may be different. For example, in one or more embodiments, it is contemplated that the first doped region may be wider than the second doped region at the respective borders with the floating gate, and the borders may be non-parallel to further elongate the first border relative to the second border. As another example, in one or more embodiments, it is contemplated that the first doped region may be less wide than the second doped region at the respective borders with the floating gate, and the borders may be non-parallel to overcome this fact and render the first border nevertheless longer than the second border. These are just a few illustrative examples and other examples are also contemplated.

As previously mentioned, the extra border length at the first doped region may provide extra capacitance. Advantageously, the extra capacitance may help to un-restrict or enhance channel flow, which may facilitate storing the charge of the amount that encodes the value on the floating gate. This will be discussed further below.

FIGS. 7A-C are top planar views of three illustrative examples of suitable layouts for an asymmetric FET, according to various embodiments of FIG. 6. Each of the layouts shows a first doped region 708 a second doped region 710, a channel region 712 defined between the doped regions, and a floating gate 716 over the channel region. In the drawings, the terminal letters A, B, and C are appended to each of the reference numerals of the respective FIGS. 7A-5C to indicate the components thereof.

In each of FIGS. 7A-7C, the floating gate and the first and the second doped regions are shaped such that the floating gate 716 defines with the first doped region 708 a first border of a first length, and the floating gate 716 defines with the second doped region 710 a second border of a second length that is less than the first length. In embodiments of the invention, the second length is less than 90% of the first length, or possibly from 20 to 85% of the first length.

In each of FIGS. 7A-7C, the first and second borders are non-parallel. Furthermore, in each of FIGS. 7A-7C, the widths of the first and second doped regions are substantially equal at the borders with the floating gate, although as previously discussed this is not required.

In FIGS. 7A and 7B the borders of the first doped regions with the floating gates are substantially not straight. In particular, in FIG. 7A, the first doped region and the first border have a rectangular portion receding from the second doped region. Likewise, in FIG. 7B, the first doped region and the first border have a triangular portion protruding toward the second doped region. These protruding and receding portions each have a portion that is angled or non-parallel relative to the second border.

Other sizes and shapes of protruding and receding portions are also suitable, such as, for example, curvilinear portions. Multiple protruding portions, receding portions, or a combination of protruding and receding portions are also suitable, such as, for example, to provide a jagged, toothed, or serpentine border.

In FIG. 7c the borders of the doped regions with the floating gate are both substantially straight. In particular, each of the borders is a straight line, with the first border angled relative to the second border to increase its length. The second border is perpendicular to the channel length direction between the doped regions (i.e., the direction of current flow through channel), whereas the first border is non-perpendicular or angled relative to this direction. Steeper or narrower angles are also suitable.

Notice that in each of FIGS. 7A-7C, a shape of the floating gate is modified so that it is not a simple rectangular shape. In particular, in FIG. 7A, the floating gate has a rectangular portion projecting into the first doped region. Likewise, in FIG. 7B, the floating gate has a triangular portion receding away from the first doped region. In FIG. 7C, the floating gate has a quadrilateral shape, with only two sides parallel. Notice also that in each of the layouts of FIGS. 7A-7C, the ratio of the first border length to the second border length is tolerant of misalignment of the floating gate.

These are just a few illustrative examples of non-parallel borders to provide different border lengths. Other examples will be apparent to those skilled in the art, and having the benefit of the present disclosure.

Furthermore, it is to be appreciated that a combination of the approaches shown in FIG. 4 and FIG. 6 may optionally be used. In other words, different widths of the doped regions at the borders may be used in combination with non-parallel borders. For example, the layouts shown in FIGS. 5A-5F may be combined with the layouts shown in FIGS. 7A-7C in various combinations.

Figure 8:
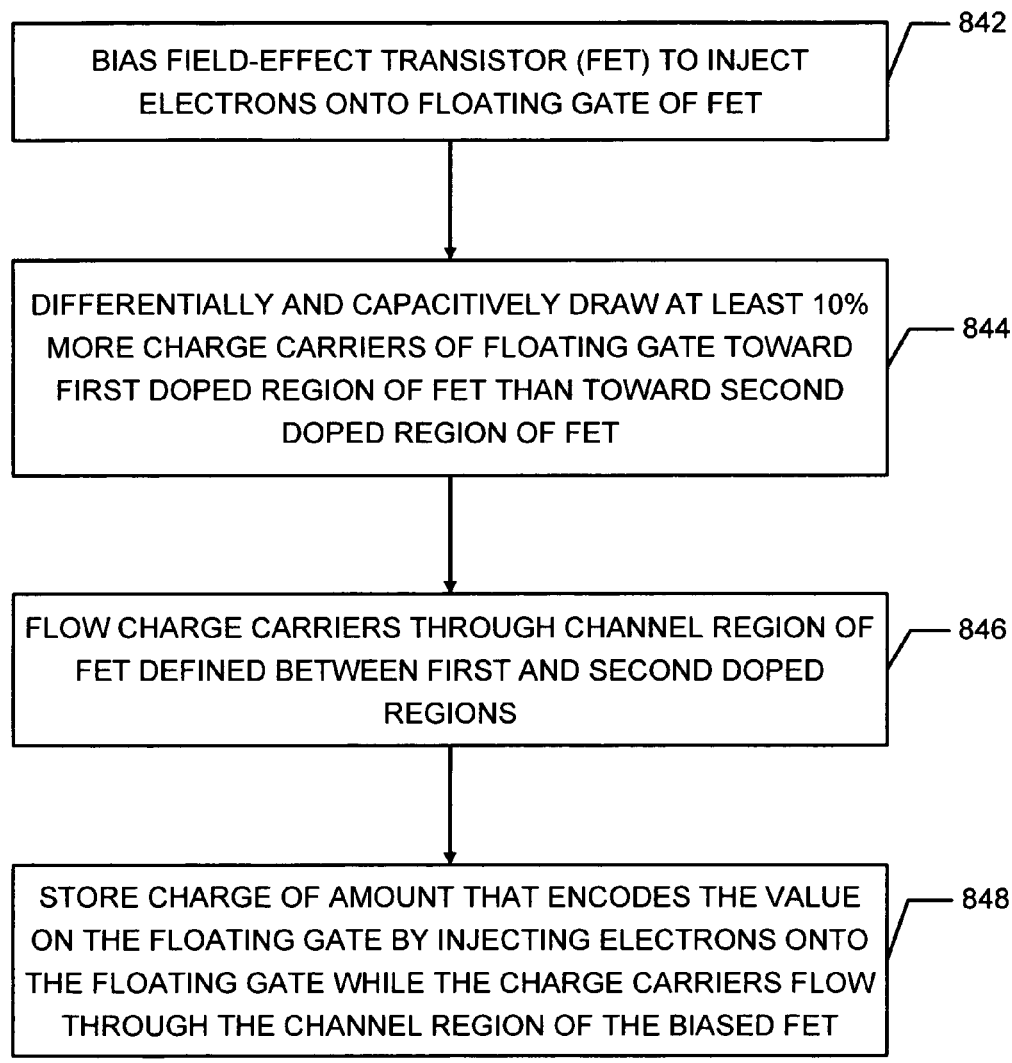
FIG. 8 is a block flow diagram of a method of storing a value in a FET of a non-volatile memory, according to embodiments of the invention.

FIG. 8 is a block flow diagram of a method 800 of storing a value in an asymmetric field-effect transistor (FET) of a non-volatile memory (NVM), according to embodiments of the invention. In embodiments of the invention, impact ionized hot-electron injection (IHEI) or channel hot-electron injection (CHEI) may be used to inject electrons onto a floating gate of the FET to store the value.

At block 842, the FET may be biased to inject electrons onto a floating gate of the FET. In a pFET the source and the n-well may be biased to a high voltage and the drain may be biased to a low voltage. For example, the source and the n-well may be biased to Vdd and the drain may be biased to −Vdd. As another example, the source and the n-well may be biased to 2*Vdd and the drain may be biased to GND. In an nFET, the source and the substrate may be biased to a low voltage and the drain may be biased to a high voltage. For example, the source and the substrate may be biased to −Vdd and the drain may be biased to Vdd.

Then, at least 10% more charge carriers (e.g., electrons or holes) of the floating gate may be differentially and capacitively drawn toward a first doped region of the FET than toward a second doped region of the FET, at block 844. The extra border length of the first doped region relative to the border length of the second doped region may provide this differential capacitive coupling.

Figure 3A:
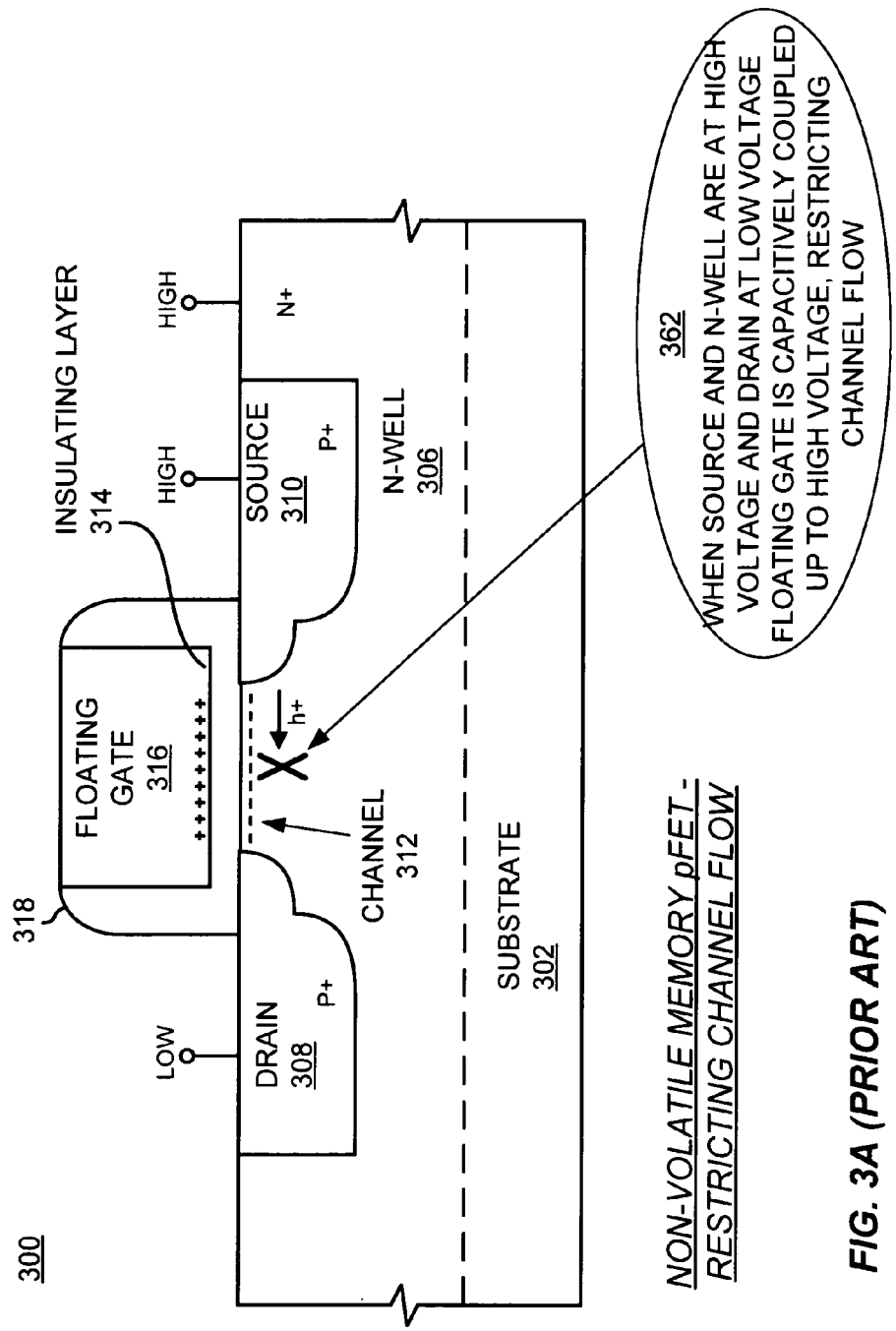
FIG. 3A is a cross-sectional side view illustrating restriction of channel flow in a pFET-based non-volatile memory device that omits a control gate.
Figure 3B:
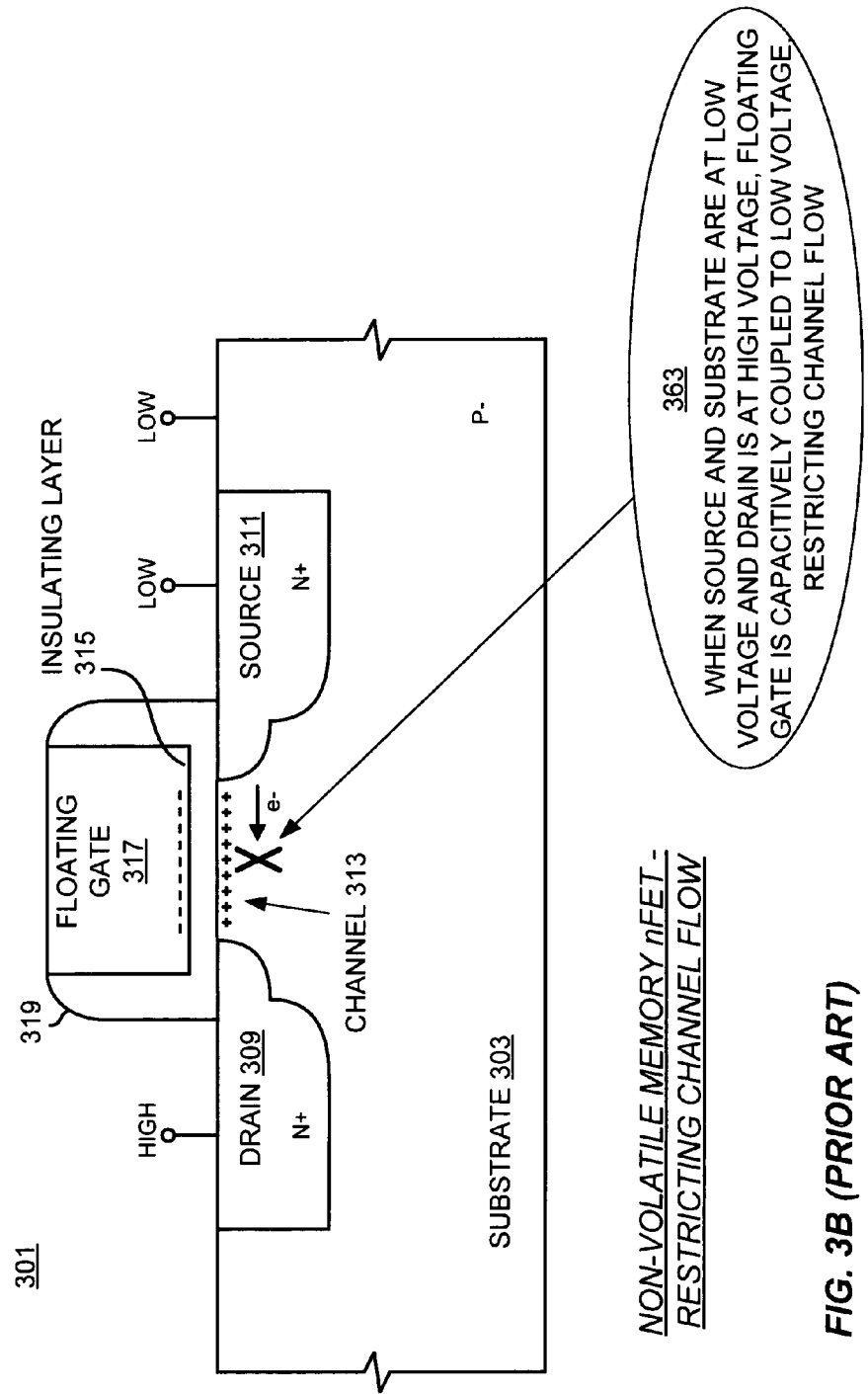
FIG. 3B is a cross-sectional side view illustrating restriction of channel flow in an nFET-based non-volatile memory device that omits a control gate.

As previously mentioned, in embodiments of the invention, the asymmetric FET may lack a dedicated control gate to control the voltage on the floating gate. Recall that such a dedicated control gate was used in the prior art FET shown in FIGS. 2A-B to control the voltage on the floating gate, and help bias the FET into a high channel current injection state. Elimination of this control gate may allow a smaller NVM device. However, without such a dedicated control gate, it may be challenging to sufficiently inject the electrons onto the floating gate. As discussed for FIG. 3A, in a pFET when the source and the N-well are biased to a high voltage (e.g., pulled high) and the drain is biased to a low voltage (e.g., pulled low), then the floating gate may tend to be capacitively coupled up to a high voltage, which may restrict channel flow. As discussed for FIG. 3B, in an nFET when the source and the substrate are biased to a low voltage (e.g., pulled low) and the drain is biased to a high voltage (e.g., pulled high), then the floating gate may tend to be capacitively coupled down to a low voltage, which may restrict channel flow. This restriction of the channel flow may tend to hinder injection of charge carriers onto the floating gate.

However, differentially and capacitively drawing more of the charge carriers of the floating gate toward the first doped region of the FET, for example the drain region, than toward the second doped region of the FET, for example the source region, may help to enhance channel flow.

Figure 9:
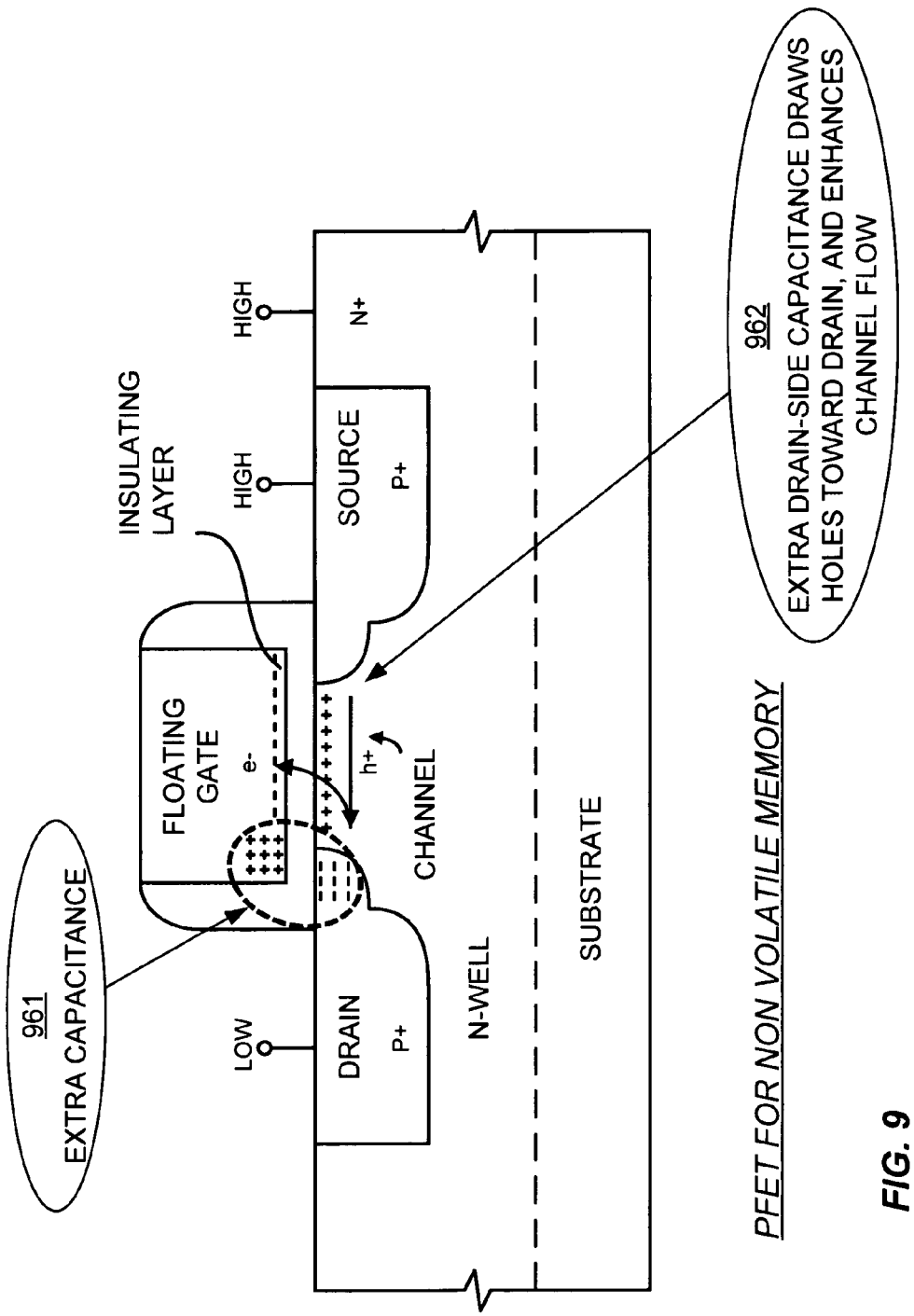
FIG. 9 is a cross-sectional side view illustrating enhancement of channel flow due to extra drain side capacitance in a pFET-based non-volatile memory device, according to one embodiment of the invention.

FIG. 9 is a cross-sectional side view of a pFET for non-volatile memory having extra drain-side capacitance 961, according to embodiments of the invention. Aside from the extra drain-side capacitance and the corresponding increased drain-side border length, the pFET-based non-volatile memory device may be similar to that shown in FIG. 3A. The extra capacitance of the drain may help to capacitively couple down or reduce the voltage on the floating gate. As shown at comment 962, the extra drain-side capacitance may draw holes of the floating gate toward the drain. This may enhances the flow of holes through the channel.

Figure 10:
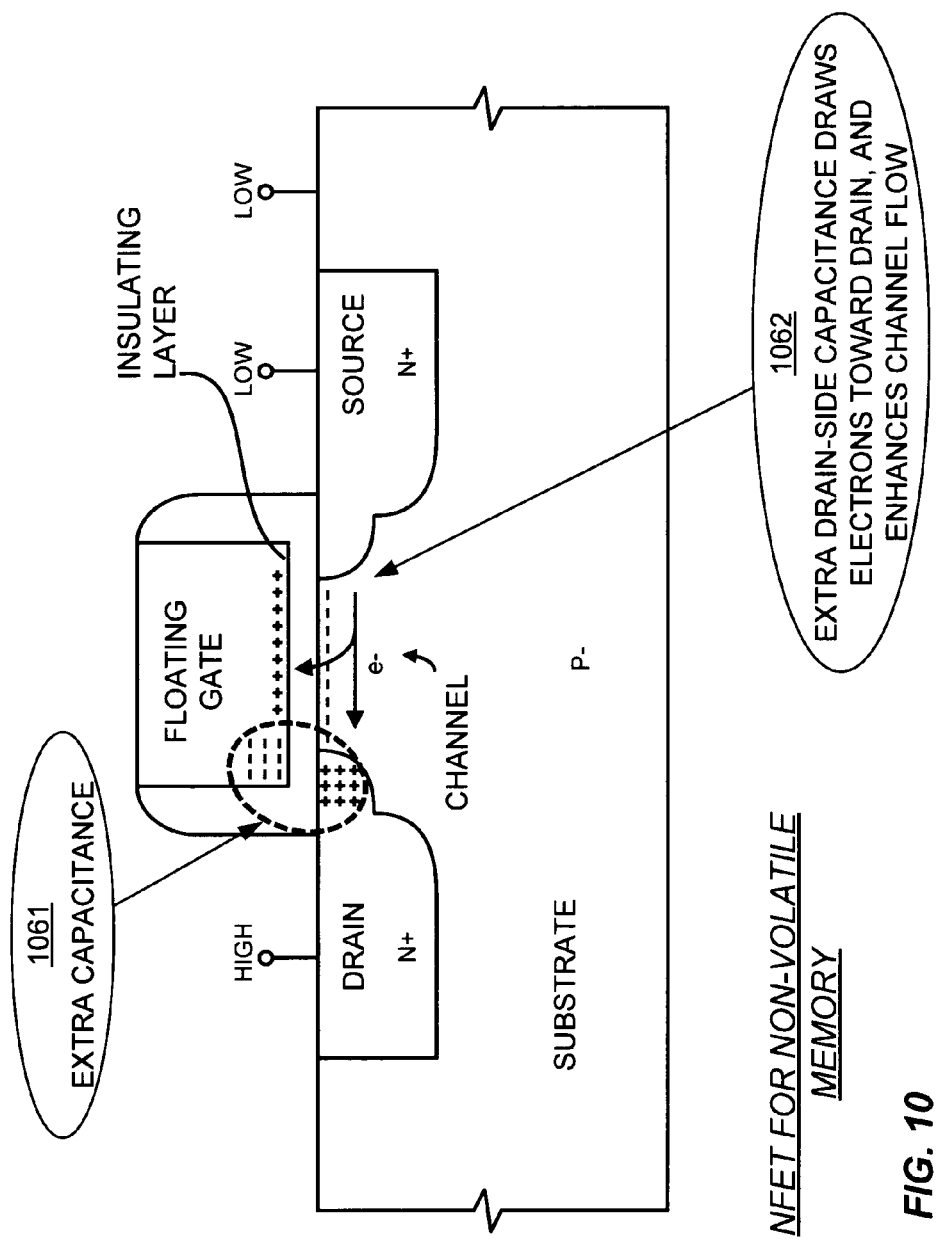
FIG. 10 is a cross-sectional side view illustrating enhancement of channel flow due to extra drain side capacitance in an nFET-based non-volatile memory device, according to one embodiment of the invention.

FIG. 10 is a cross-sectional side view of an nFET for non-volatile memory having extra drain-side capacitance 1061, according to embodiments of the invention. Aside from the extra drain-side capacitance and the corresponding increased drain-side border length, the nFET-based non-volatile memory device may be similar to that shown in FIG. 3B. The extra capacitance of the drain may help to capacitively couple up or increase the voltage on the floating gate. As shown at 1062, the extra drain-side capacitance may draw electrons of the floating gate toward the drain. This may enhance the flow of electrons through the channel.

Referring again to FIG. 8, as a result of the biasing conditions, charge carriers may be flowed through a channel region of the FET between the first and second doped regions, at block 846. In a pFET holes may be flowed through the channel region. In an nFET electrons may be flowed through the channel region. As discussed, the extra capacitance of the first doped region may help to increase the flow of the charge carriers through the channel region.

Then, charge of an amount that encodes the value may be stored on the floating gate by injecting the electrons onto the floating gate of the FET while the charge carriers flow through the channel region of the biased FET, at block 848.

Without wishing to be bound by theory, in the case of IHEI, the holes that are flowing across the channel from the source to the drain may enter a drain depletion region in the vicinity of the drain/N-well junction, where the holes may collide with atoms of the semiconductor lattice and generate electron-hole pairs. This phenomenon is known as "impact ionization". The generated holes may be collected by the drain 36, while the generated electrons may be expelled from the drain depletion region with a high kinetic energy attributable to a high electric field in the drain depletion region. The high-energy electrons that collide with the semiconductor lattice may be scattered upward and attracted by the positive charge and/or higher potential of floating gate. These high-energy electrons may then be injected into the conduction band of the insulating layer and onto the floating gate. This process is known as "impact-ionized hot-electron injection" (IHEI).

Without wishing to be bound by theory, in the case of CHEI as the electrons flow from the source, across the channel region, to the drain, the electrons may collide with atoms of the semiconductor lattice and generate what are known as "hot electrons". These hot electrons may be attracted to the positive charges and/or the low voltage of the floating gate. By a process known as channel hot-electron injection (CHEI), the electrons may be injected through the insulating layer and onto the floating gate.

The increased flow of the charge carriers through the channel may provide a corresponding increase in the rate and/or extent of injection of electrons onto the floating gate. Generally a higher channel flow promotes injection of electrons onto the floating gate by either IHEI or CHEI.

The asymmetric FET of the above-described method may have any of the characteristics of the other asymmetric FETs described herein. To briefly review, in embodiments of the invention, the charge carriers of the floating gate may be drawn toward a first border between the floating gate and the first doped region that is at least 10% longer, or optionally 1.15 to 5 times longer, than a second border between the floating gate and the second doped region. In embodiments of the invention, widths of the doped regions at the borders with the floating gate may be substantially unequal. In embodiments of the invention, the borders of the doped regions with the floating gate may be non-parallel. In embodiments of the invention, the first border may be either substantially straight or substantially not straight. In embodiments of the invention, the first border may have a portion of the first doped region that protrudes towards the second doped region and/or a portion of the first doped region that recedes from the second doped region. These are just a few illustrative examples.

Figure 11:
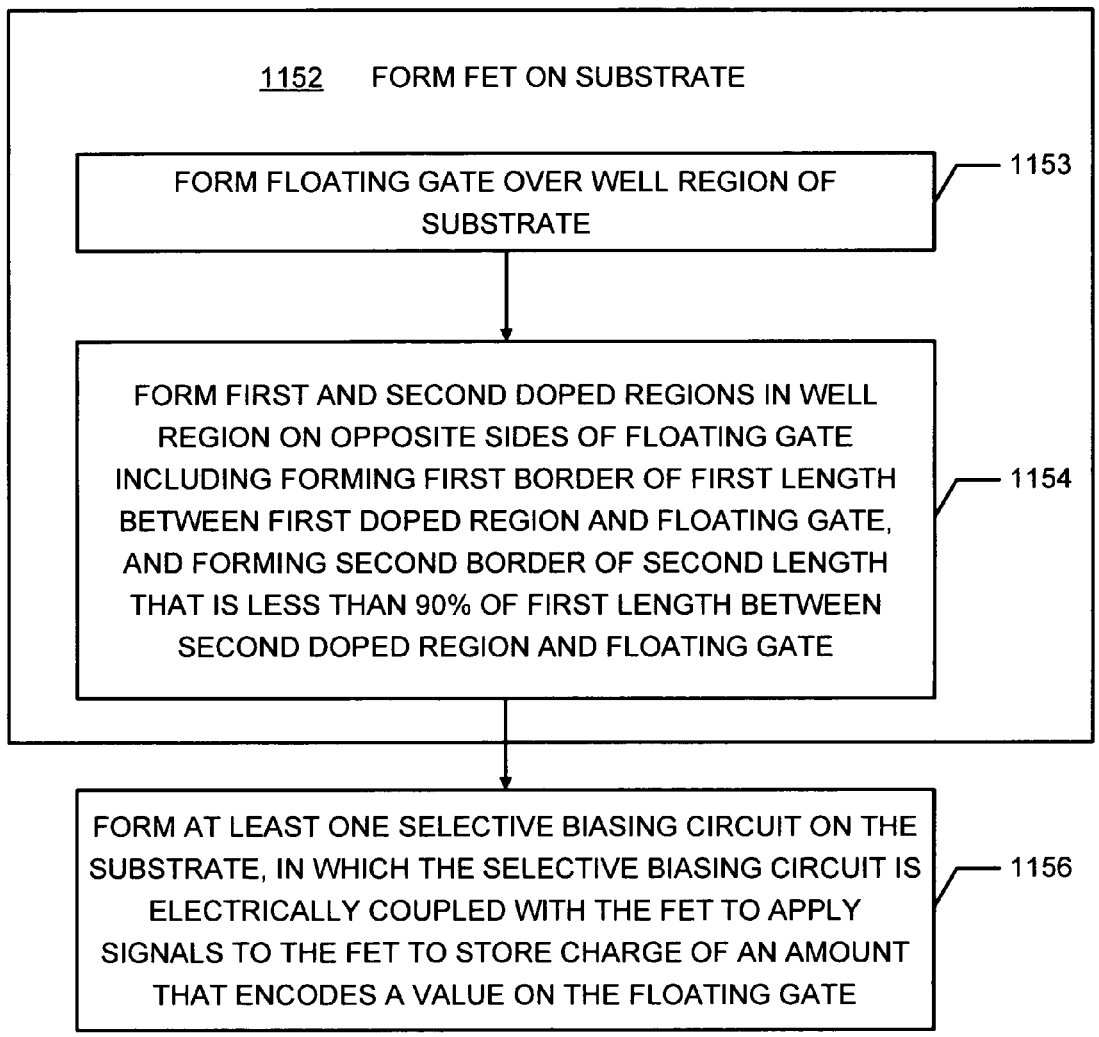
FIG. 11 is a block flow diagram of a method of manufacturing a non-volatile memory device including a FET, according to embodiments of the invention.

FIG. 11 is a block flow diagram of a method of manufacturing or otherwise forming a non-volatile memory (NVM) device including a field-effect transistor (FET), according to embodiments of the invention. Advantageously, in embodiments of the invention, the NVM device may be formed during a standard Complementary Metal Oxide Semiconductor (CMOS) process. In one aspect, this compatibility with a standard CMOS process may help to allow the NVM device including the asymmetric FET to be incorporated or integrated as embedded non-volatile memory on an integrated circuit that is manufactured by a standard CMOS process, although the scope of the invention is not so limited.

At block 1152, a FET may be formed on a substrate. This may include forming a floating gate over a well region of the substrate, at block 1153. Initially, this may include depositing or otherwise forming a high quality gate oxide over the well region to serve as the insulating layer and then depositing a polysilicon layer over the insulating layer to serve as a floating gate. Examples of suitable depositions include, but are not limited to, chemical vapor deposition (CVD), physical vapor deposition (PVD), and atomic layer deposition (ALD). Then, a resist layer may be lithographically patterned and a patterned etch may be performed to form the floating gate and insulating layer.

Forming the FET on the substrate may also include forming first and second doped regions in the well region on opposite sides of the floating gate, at block 1154. Suitable approaches for forming the doped regions include, but are not limited to, diffusion and ion implantation. In embodiments of the invention, this may include forming a first border of a first length between the first doped region and the floating gate, and forming a second border of a second length that is less than 90% of the first length between the second doped region and the floating gate. The borders may have any of the characteristics of the borders of the asymmetric transistors described elsewhere herein.

At block 1156, at least one selective biasing circuit may optionally be formed on the substrate. The at least one selective biasing circuit may be electrically coupled with the FET to apply signals to the FET to store charge of an amount that encodes a value on the floating gate. Alternatively, a selective biasing circuit may optionally be included off-substrate, such as, for example, in manufacturing equipment.

Figure 12:
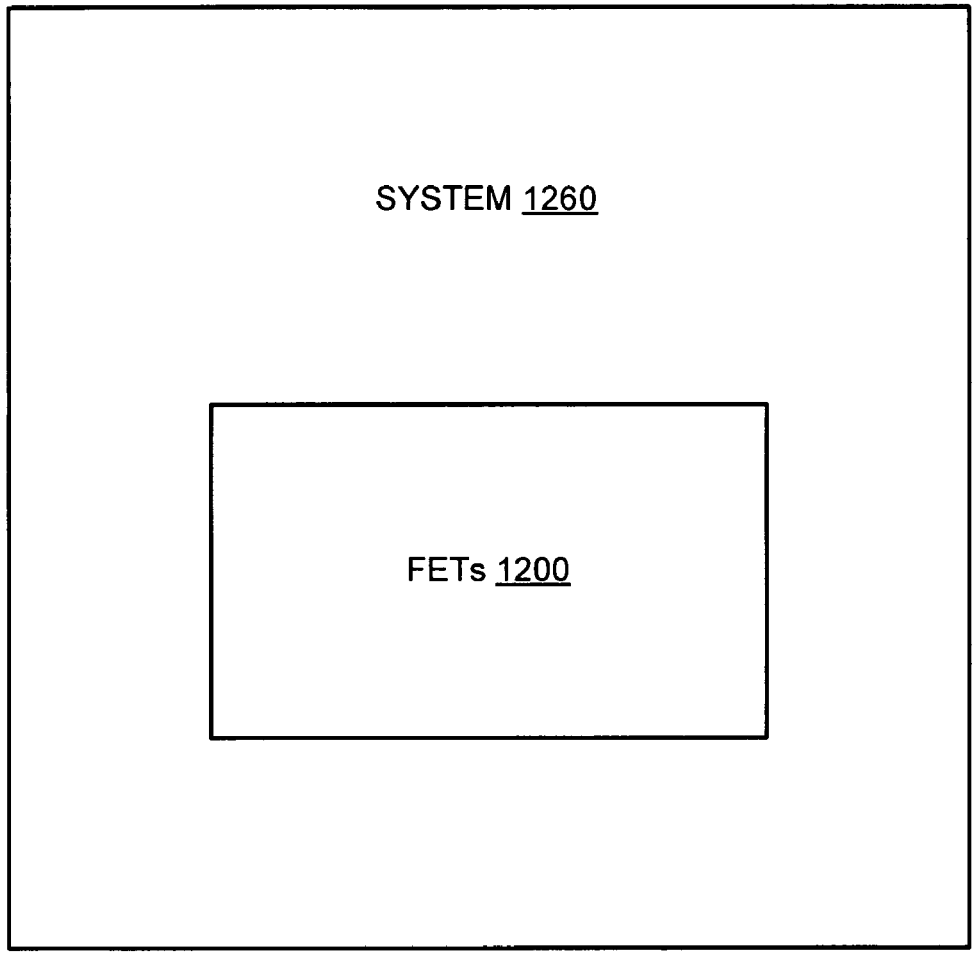
FIG. 12 is a block diagram of a system incorporating non-volatile memories including asymmetric FETs as described herein, according to embodiments of the invention.

FIG. 12 is a block diagram of a system 1260 incorporating asymmetric FETs 1200 as described herein, according to embodiments of the invention. The FETs may be used to provide One Time Programmable (OTP) non-volatile memory (NVM) for the system. OTP memory means memory that is programmable only one time, as opposed to many. If desired, in one or more embodiments of the invention, multiple banks or other sets of the OTP asymmetric FETs as disclosed herein may be included in a system in order to allow the system to be multiple time programmable (MTP). Each of the banks of the OTP asymmetric FETs may be programmed only once, but potentially each at different times and with different data in order to allow the overall system to appear to be or behave like a MTP system.

The system may represent a wide variety of conventional systems known in the arts. Examples of suitable systems include, but are not limited to, small portable handheld electronic devices (e.g., cell phones, PDAs, digital audio players, and digital cameras), and wireless communications devices (e.g., cellular phones, cordless phones, pagers, and PDAs). Other examples of suitable systems include, but are not limited to, computer systems (e.g., servers, laptops, desktops, personal digital assistants (PDAs), and other hand-held computer systems), computer system peripherals (e.g., printers, scanners, and monitors), and network equipment (e.g., switches, routers, and modems). Still other examples of suitable systems include, but are not limited to, entertainment devices (e.g., televisions, set-top boxes, DVD players, video recorders, camcorders, digital audio players, compact disc players, stereos, and radios). Yet other examples of suitable systems include, but are not limited to, small portable memory devices (e.g., memory cards and Universal Serial Bus (USB) Flash drives). Still further examples of suitable systems include, but are not limited to, radiofrequency identification (RFID) tags and other RFID devices.

As mentioned, the FETs may be used to provide OTP NVM for the system. In one or more embodiments of the invention, the FETs or OTP NVM may be embedded memory that is integrated with another integrated circuit. The FETs or OTP NVM may be used to store a wide variety of different types of unchanging information suitable for OTP NVM. Examples of suitable types of information that may be stored in the FETs include, but are not limited to, encryption keys, analog trim values, device identification information, configuration information, and other types of unchanging information known in the arts. The scope of the invention is not limited to any known type of information.

To further illustrate certain concepts, consider the following illustrative examples.

As one example, in one or more embodiments of the invention, the asymmetric FETs disclosed herein may be included as a small amount of embedded OTP NVM in an integrated circuit of a memory card (e.g., for a digital camera, PDA, cell phone, or computer system), universal serial bus (USB) Flash drive (e.g., for a computer system), or other small portable memory device. Examples of suitable small portable memory devices include, but are not limited to, those manufactured by SanDisk Corporation, of Milpitas, Calif. As one particular illustrative example, the FETs may be embedded in a logic control chip on a small portable memory device to store an encryption key. The encryption key may allow data to be encrypted as it flows through the logic chip. A potential advantage is that the data may remain encrypted or unreadable if someone replaces the logic chip of the small portable memory device. This is just one particular example, and the scope of the invention is not limited to this particular example.

As another example, in one or more embodiments of the invention, the asymmetric FETs disclosed herein may be included as embedded memory in a liquid crystal display (LCD) driver integrated circuit. The LCD driver integrated circuit may be used to drive an LCD of a small portable handheld electronic device (e.g., a cell phone, PDA, digital audio player, or digital camera), or a wireless communications device (e.g., a cellular phone, cordless phone, pager, or PDA). In one or more embodiments of the invention, the asymmetric FETs may be used to store analog trim information to perform gamma correction to trim the display to account for manufacturing variation, although the scope of the invention is not so limited. The analog trim information may represent relatively unchanging information that may be stored in the OTP NVM at the time of manufacture.

As yet another example, in one or more embodiments of the invention, the asymmetric FETs disclosed herein may be included as embedded memory in a radio frequency identification (RFID) device. Example RFIDs include, but are not limited to, those manufactured by Impinj Inc., of Seattle, Wash. The asymmetric FETs may be used to store a unique number representing RFID device identification data for a class 0 (C0) RFID device, although the scope of the invention is not so limited. Such C0 RFID typically include a OTP memory to store unchanging RFID device identification data.

A potential advantage of using the asymmetric FETs disclosed herein to store such data is that the asymmetric FETs are compatible with standard CMOS processing without adding additional processing steps. Accordingly, in embodiments of the invention, the asymmetric FETs may be incorporated directly into an integrated circuit or microelectronic device manufactured by a CMOS process without changing the CMOS process or using additional processes. Another potential advantage of using the asymmetric FETs disclosed herein to store such data is that due in part to the elimination of the dedicated control gate the asymmetric FETs as disclosed herein may be manufactured smaller and potentially correspondingly cheaper than certain known NVM FETs that have the dedicated control gate.

In the description above, different border lengths have been used to provide different capacitance. As another option, in one or more alternate embodiments of the invention, different dielectric constants may be used for the different borders to create different capacitances. As another option, in one or more alternate embodiments of the invention, different amounts of overlap or different sized extension regions may be used to create different capacitances.

In the description and claims, the terms "coupled" and/or "connected," along with their derivatives, have been used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the sizes, shapes, configurations, forms, functions, materials, and manner of operation, and assembly and use, of the components of the embodiments. All equivalent relationships to those illustrated in the drawings and described in the specification are encompassed within embodiments of the invention.

For simplicity and clarity of illustration, elements illustrated in the figures have not necessarily been drawn to scale. For example, the dimensions of some of the elements are exaggerated relative to other elements for clarity. Further, where considered appropriate, reference numerals or terminal portions of reference numerals have been repeated among the figures to indicate corresponding or analogous elements, which may optionally have similar characteristics.

Various operations and methods have been described. Some of the methods have been described in a basic form, but operations may optionally be added to and/or removed from the methods. The operations of the methods may also often optionally be performed in different order. Many modifications and adaptations may be made to the methods and are contemplated.

For clarity, in the claims, any element that does not explicitly state "means for" performing a specified function, or "step for" performing a specified function, is not to be interpreted as a "means" or "step" clause as specified in 35 U.S.C. Section 112, Paragraph 6. In particular, any potential use of "step of" in the claims herein is not intended to invoke the provisions of 35 U.S.C. Section 112, Paragraph 6.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A radio frequency identification (RFID) tag, comprising:
   an antenna; and,
   a circuit having a non-volatile memory (NVM) device to store a value, comprising:
      a substrate; and
      a field-effect transistor (FET) including:
         a first doped region in the substrate;
         a second doped region in the substrate, the first and the second doped regions defining a channel region of the substrate between them;
         an insulating layer over the channel region; and
         a floating gate over the insulating layer to store charge of an amount that encodes the value, in which the floating gate and the first and the second doped regions are shaped such that the floating gate defines with the first doped region a first border of a first length, and the floating gate defines with the second doped region a second border of a second length that is less than 90% of the first length, wherein the floating gate is not coupled with a control gate.

2. The RFID tag of claim 1, in which the first and second doped regions are p-type.

3. The RFID tag of claim 1, in which the first and second doped regions are n-type.

4. The RFID tag of claim 1, in which the first doped region comprises a source region and the second doped region comprises a drain region.

5. The RFID tag of claim 1, in which the first doped region comprises a drain region and the second doped region comprises a source region.

6. The RFID tag of claim 1, in which a width of the second doped region at the second border is substantially equal to a width of the first doped region at the first border.

7. The RFID tag of claim 1, in which a width of the second doped region at the second border is less than 90% of a width of the first doped region at the first border.

8. The RFID tag of claim 1, in which the first and second borders are substantially straight.

9. The RFID tag of claim 1, in which at least a portion of the first border is angled relative to the second border.

10. The RFID tag of claim 1, in which the first border is substantially not straight.

11. The RFID tag of claim 1, in which the first doped region has a portion protruding toward the second doped region.

12. The RFID tag of claim 1, in which the first doped region has a portion receding from the second doped region.

13. The RFID tag of claim 1, in which the second border length ranges from 20% to 85% of the first border length.

14. The RFID tag of claim 1, in which the floating gate overlaps extension regions of the first doped region along the first border, and the floating gate overlaps extension regions of the second doped region along the second border.

* * * * *